US006181294B1

(12) United States Patent
Porter et al.

(10) Patent No.: US 6,181,294 B1
(45) Date of Patent: Jan. 30, 2001

(54) ANTENNA FOR ELECTRIC METER AND METHOD OF MANUFACTURE THEREOF

(75) Inventors: Lawrence R. Porter, Dallas; John Paul King, Arlington, both of TX (US); Doug Justice, Wilsonville, OR (US)

(73) Assignee: TransData, Inc., Richardson, TX (US)

( * ) Notice: Under 35 U.S.C. 154(b), the term of this patent shall be extended for 0 days.

(21) Appl. No.: 09/040,113

(22) Filed: Mar. 17, 1998

(51) Int. Cl.[7] ....................................... H01Q 1/50
(52) U.S. Cl. .................... 343/859; 343/719; 343/872; 340/870.02; 340/870.03; 324/142
(58) Field of Search .................... 343/859, 719, 343/795, 872, 858, 865, 797, 860, 850, 852, 803; 340/870.02, 870.03, 870.3, 870.01, 870.11, 870.18; 324/113, 116, 156, 142, 464, 383

(56) References Cited

U.S. PATENT DOCUMENTS

| | | | |
|---|---|---|---|
| 3,059,849 | * 10/1962 | Saltzman | 235/91 |
| 3,705,385 | 12/1972 | Batz | 340/152 R |
| 3,754,250 | 8/1973 | Bruner | 343/6.5 LC |
| 3,913,400 | * 10/1975 | Floren | 73/273 |
| 3,956,740 | 5/1976 | Jones et al. | 340/172.5 |
| 4,085,287 | * 4/1978 | Kullmann et al. | 178/66 R |
| 4,350,980 | 9/1982 | Ward | 340/870.02 |
| 4,361,877 | 11/1982 | Dyer et al. | 364/900 |
| 4,396,915 | 8/1983 | Farnsworth et al. | 340/870.03 |
| 4,399,510 | 8/1983 | Hicks | 364/464 |
| 4,467,434 | 8/1984 | Hurley et al. | 364/483 |
| 4,608,563 | 8/1986 | Hoffman | 340/870.02 |
| 4,660,035 | 4/1987 | Hoffman | 340/870.02 |
| 4,744,004 | 5/1988 | Hammond | 361/372 |
| 4,884,021 | 11/1989 | Hammond et al. | 324/142 |
| 4,998,102 | * 3/1991 | Wyler et al. | 340/870.02 |
| 5,122,735 | 6/1992 | Porter et al. | 324/142 |
| 5,229,713 | 7/1993 | Bullock et al. | 324/142 |
| 5,253,151 | 10/1993 | Mepham et al. | 362/216 |
| 5,298,894 | * 3/1994 | Cerny et al. | 340/870.02 |
| 5,583,492 | * 12/1996 | Nakanishi et al. | 340/870.02 |
| 5,621,419 | * 4/1997 | Meek et al. | 343/770 |
| 5,627,759 | 5/1997 | Bearden et al. | 364/483 |
| 5,825,303 | * 10/1998 | Bloss et al. | 340/870.02 |

OTHER PUBLICATIONS

Descriptive Bulletin entitled "Power Logic Circuit Monitor" Feb. 1991: 7 pages: Bulletin DB–100 Rev 1: by Square D Company.
Bulletin 11631 entitled "Fulcrum SQ400 Electronic Multifunction Meter" Effective Date Aug. 1994: 4 pages: by Schlumberger.

* cited by examiner

Primary Examiner—Tho Phan

(57) ABSTRACT

For use with an electric meter chassis having a dielectric housing protruding therefrom, an antenna for allowing electric meter circuitry within the chassis to communicate wirelessly through the dielectric housing and a method of manufacturing the same. In one embodiment, the antenna includes: (1) antenna elements, located within the dielectric housing and adapted to transmit and receive electromagnetic radiation and (2) a balance circuit, coupled to the antenna elements to cause the antenna elements to act as an antenna and couplable to an unbalanced output port of a wireless communication circuit, that balances an impedance of the unbalanced output port thereby to balance the antenna.

30 Claims, 2 Drawing Sheets

ANTENNA FOR ELECTRIC METER AND METHOD OF MANUFACTURE THEREOF

TECHNICAL FIELD OF THE INVENTION

The present invention is directed, in general, to electric meters and, more specifically, to an antenna for an electric meter to enable the meter to communicate over a public wireless data network, a method of manufacturing the antenna and an electric meter employing the antenna.

BACKGROUND OF THE INVENTION

Until recently, a single utility provided electric service to all consumers in a given area. Establishment of electric service, maintenance, meter reading and billing were centralized in the single utility. Customers had no freedom to choose their electricity provider. Now, the kind of deregulation that changed the face of the telecommunications industry is sweeping through the electric power industry. One by one, states are allowing electric power resellers to buy electricity in quantity and to resell the electricity directly to consumers.

At the same time, electricity providers are becoming more sophisticated about billing practices. Gone are the days when consumers were billed flat rates. Numbered are the days that consumers are simply billed on the basis of kilowatt-hours consumed. Now, electricity providers are interested in gathering qualitative and additional quantitative data regarding electrical service delivered to consumers in an effort to correlate charges and costs of the service provided.

In response, consumers (particularly commercial consumers) are becoming more sophisticated regarding their use of electricity. Realizing that management of electrical usage may result in monetary savings, consumers are also demanding greater amounts of qualitative and quantitative data.

The electric meter industry has responded with digital electric meters that measure such characteristics as volt-hours, volt-squared-hours, watt-hours, kilowatt-hours, Qhours, VAR-hours and VA-hours over time, giving both the electricity provider and the consumer a greater quantity of, and more timely, data regarding electricity use. Examples of digital meters may be found in U.S. Pat. No. 4,884,021, issued Nov. 28, 1989, to Hammond, et al., entitled "Digital Power Metering" and U.S. Pat. No. 5,122,735, issued Jun. 16, 1992, to Porter, et al., also entitled "Digital Power Metering," commonly assigned with the present invention and incorporated herein by reference. Digital meters can measure these characteristics instantaneously or over a period of time, allowing electricity providers to track peak electricity usage and to better plan generator capacity. Electricity providers may then allow consumers to reduce costs by avoiding peak usage periods. Overall, digital meters have brought about more accurate measurement and billing and, in some cases, have resulted in more cost-effective use on the consumer's part.

Like traditional mechanical meters, many digital meters must be read by direct visual observation. In large urban areas with millions of customers, this represents a considerable labor cost, even when spread out over an entire month. Additionally, meters have proven difficult to read from distances over 12 feet. Intervening fences, brush, trees, yard tools and pets may make close access difficult or even impossible. Sun glint and bad weather may add to the problem, particularly in remote areas with poor roads or during winter storms that may cover the meters with snow or ice. Ever-present is the risk that a meter reading may be erroneous. Deregulation of electric power may exacerbate this problem by creating geographically distributed electricity providers, thereby dramatically increasing the cost of reading meters and potentially threatening the economics of deregulation.

The electric meter industry has responded by adding wire-based communication circuitry to newer models of electric meters. Such circuitry typically employs a telephone line to communicate with a central location. While adequately addressing the cost issue of meter reading, the use of telephone lines introduces other problems.

If an electric meter is given a dedicated telephone line, the cost of the dedicated line must be considered when calculating the cost of reading the meter. On the other hand, if the electric meter shares a telephone line with another user (e.g., a residential meter may employ the residence's main telephone line), the line may not be available when required by the meter. In fact, a consumer may intentionally make the line unavailable to the meter, thereby preventing the meter from reporting its data.

Alternatively, the meter may be provided with an external antenna to allow wireless communication over a range of a few hundred feet. A roving truck carrying a transceiver may then establish communication with the meter as it passes nearby, thus reading the meter. Unfortunately, the truck must be physically deployed to locations proximate the meters. Truck-based wireless reading, therefore, provides only a marginal advantage over direct visual observation. Further, the meter's external antenna may be subject to tampering and to severe weather.

Accordingly, what is needed in the art is a more effective way to receive frequent, timely and accurate electrical consumption data from, and provide remote commands to, geographically-distributed electric meters.

SUMMARY OF THE INVENTION

To address the above-discussed deficiencies of the prior art, the present invention provides, for use with an electric meter chassis having a dielectric housing (of any geometry) protruding therefrom, an antenna for allowing electric meter circuitry within the chassis to communicate wirelessly through the dielectric housing and a method of manufacturing the same. In one embodiment, the antenna includes: (1) antenna elements, located within and generally conforming to a portion of an internal surface of the dielectric housing and adapted to transmit and receive electromagnetic radiation and (2) a balance circuit, coupled to the antenna elements to cause the antenna elements to act as a dipole and couplable to an unbalanced output port of a wireless communication circuit, that balances an impedance of the unbalanced output port thereby to balance the dipole.

The present invention therefore introduces the broad concept of outfitting an electric meter with an internal, wireless communications antenna, allowing the electric meter circuitry within the meter to communicate via a data network wirelessly couplable thereto. Such communication can be bidirectional, allowing the meter to report data to a central location or to accept remotely-generated operational commands. The range of the communications antenna is preferably sufficient to allow wireless communication with a data network, thereby eliminating a need to employ roving trucks to establish communication.

In one embodiment of the present invention, the antenna elements generally conform to a portion of an internal surface of the dielectric housing. If, as in an embodiment to be illustrated and described, the dielectric housing is cylindrical, the antenna elements can assume an arcuate form (or a straight form if conforming to an end of the housing).

In one embodiment of the present invention, the antenna further includes electric meter circuitry located in a circuit board rack within the dielectric housing, the antenna elements located between circuit boards in the circuit board rack. The electric meter circuitry, which is purely environmental with respect to the antenna embodiment of the present invention, may be distributed among separate, perhaps interconnected, circuit boards in the rack. Alternatively, the electric meter circuitry may be contained in another portion of the electric meter chassis.

In one embodiment of the present invention, the antenna further includes: (1) electric meter circuitry located in the dielectric housing and (2) an electromagnetic shield located about at least a portion of the electric meter circuitry. The electromagnetic shield, while not necessary to the present invention, can improve antenna performance by decreasing interference by reason of the proximity of the electric meter circuitry to the dipole.

In one embodiment of the present invention, the antenna elements are arcuate and have a flattened lateral cross section. Of course, other conductor shapes are fully within the broad scope of the present invention.

In one embodiment of the present invention, the balance circuit is embodied on a circuit board having mounts located thereon and mechanically supports the antenna elements, the mounts allowing the antenna to be reoriented with respect to the dielectric housing. The structure and operation of the mounts and the resulting flexibility in antenna orientation will be set forth in greater detail in the description of certain embodiments of the invention that follow.

In one embodiment of the present invention, the antenna elements are first and second conductors of a dipole and the balance circuit balances an impedance of the dipole. Those skilled in the art will recognize, however, that the antenna elements can form other types of antennas, such as single pole over ground plane, Yagi or loop antennas. Although the embodiment to be illustrated and described is directed to use of a dipole, the present invention is not so limited.

In one embodiment of the present invention, the antenna further includes a wireless communication circuit having a carrier frequency of between 700 and 950 megahertz, and, more particularly, between 806 to 825 (transmit) and 851 and 870 (receive) megahertz. Those skilled in the art will realize that this range of frequencies encompasses some well-known public data wireless networks, such as Ardis® or RAM Mobile Systems®.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
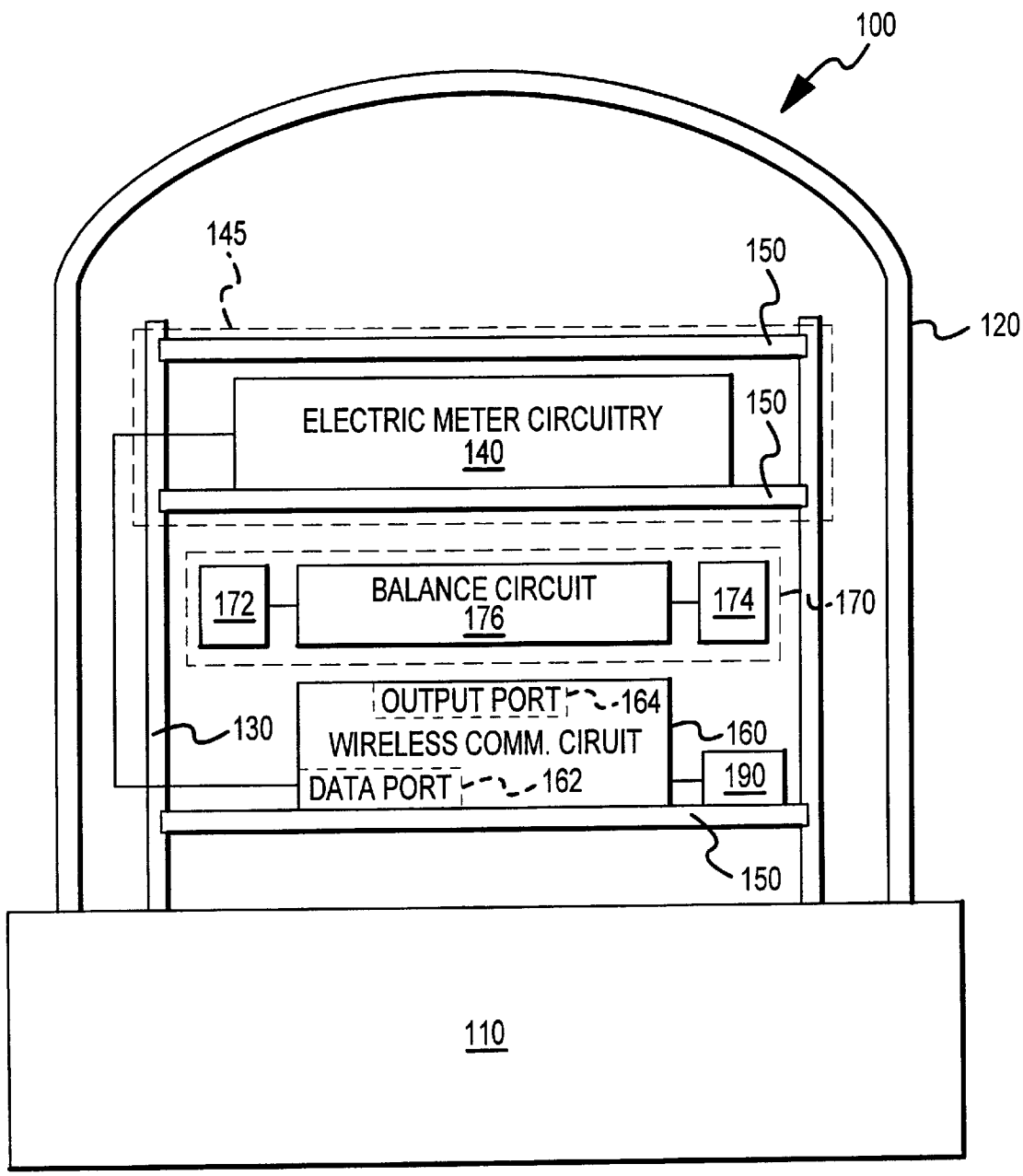
FIG. 1 illustrates a simplified block diagram of an electric meter constructed according to the principles of the present invention.

Referring initially to FIG. 1, illustrated is a simplified, combination electrical/mechanical, block diagram of an electric meter 100 constructed according to the principles of the present invention. The meter 100 includes an electric meter chassis 110, having a dielectric housing 120 protruding therefrom. In the illustrated embodiment, the dielectric housing 120 is a dome of cylindrical cross-section and intended to represent a conventional electric meter housing. Of course, the use of other geometries for the dielectric housing 120 is well within the scope of the present invention.

The meter 100 further includes a circuit board rack 130, located within the dielectric housing 120, that contains a plurality of circuit boards 150. The meter 100 further includes electric meter circuitry 140, located on one or more of the circuit boards 150. The electric meter circuitry 140 may include, for example, a microprocessor, memory, display and current or voltage sensors. The patents cited above contain greater detail concerning possible configurations for the electric meter circuitry 140.

The meter 100 further includes an electromagnetic shield 145 (illustrated in broken line), located about a portion of the electric meter circuitry 140. The meter 100 further includes a wireless communication circuit 160, coupled to the electric meter circuitry 140 via a data port 162. In a preferred embodiment, the electric meter circuitry 140 is coupled to the wireless communication circuit 160 via a flexible strip connector. Of course, the use of other coupling devices is well within the broad scope of the present invention.

The meter 100 further includes an antenna 170 that allows the electric meter circuitry 140 to communicate wirelessly through the dielectric housing 120. The meter 100 still further includes a capacitively backed up power supply 190 that powers the electric meter circuitry 140 and the wireless communication circuit 160. The meter 100 may thus communicate power outage information to the electricity provider during a loss of power.

The electromagnetic shield 145 is designed to attenuate interference from the electric meter circuitry 140 that may disrupt an operation of the wireless communication circuit 160. The electromagnetic shield 145 is also designed to protect the electric meter circuitry 140 from interference generated by the wireless communication circuit 160. Those skilled in the art will understand, however, that the electromagnetic shield 145 is not necessary to the present invention.

The antenna 170 includes antenna elements 172, 174, located within the dielectric housing 120. In the illustrated embodiment, the antenna elements 172, 174 are located between the circuit boards 150 and proximate the electric meter circuitry 140. Of course, the antenna elements 172, 174 may also be located elsewhere within the dielectric housing 120. The antenna elements 172, 174 are adapted to transmit and receive electromagnetic radiation. The antenna 170 further includes a balance circuit 176, coupled to the antenna elements 172, 174, that causes the antenna elements 172, 174 to cooperate to act as a dipole. Again, the present invention is not limited to a dipole.

The balance circuit 176 is couplable to an unbalanced output port 164 of the wireless communication circuit 160 to balance an impedance of the output port 164 and thereby to balance the dipole. The balance circuit 176 may also compensate for unfavorable electromagnetic conditions caused by, for example, sources of constructive and destructive interference within the meter 100. In one embodiment of the present invention, the balance circuit 176 is a microstrip. Of course, the use of other devices for the balance circuit 176 is well within the broad scope of the present invention.

In the illustrated embodiment, the electric meter circuitry 140 includes current and voltage sensors that scale input voltage and current, thereby allowing metering data (e.g., voltage, current, power, energy usage, power demand, power factor, time of use, interval recordings of energy usage, power quality information, power outage information, site analysis information, diagnostic information, and meter billing information) to be gathered. The data gathered may be instantaneous or may be gathered over a period of time. Those skilled in the art will realize that the present invention is not limited to the types of data mentioned herein, but may also be used to measure and gather other types of data related to the electric power provided and consumed.

The wireless communications circuit 160 and the antenna 170 allow the meter 100 to communicate via wireless communication networks, such as conventional Ardis® or RAM Mobile Systems® Wireless Data networks. The meter 100 may thus report data to the electricity provider. In a preferred embodiment, the communication is bidirectional, allowing the meter 100 to report data or to accept remotely-generated operational commands.

Figure 2:
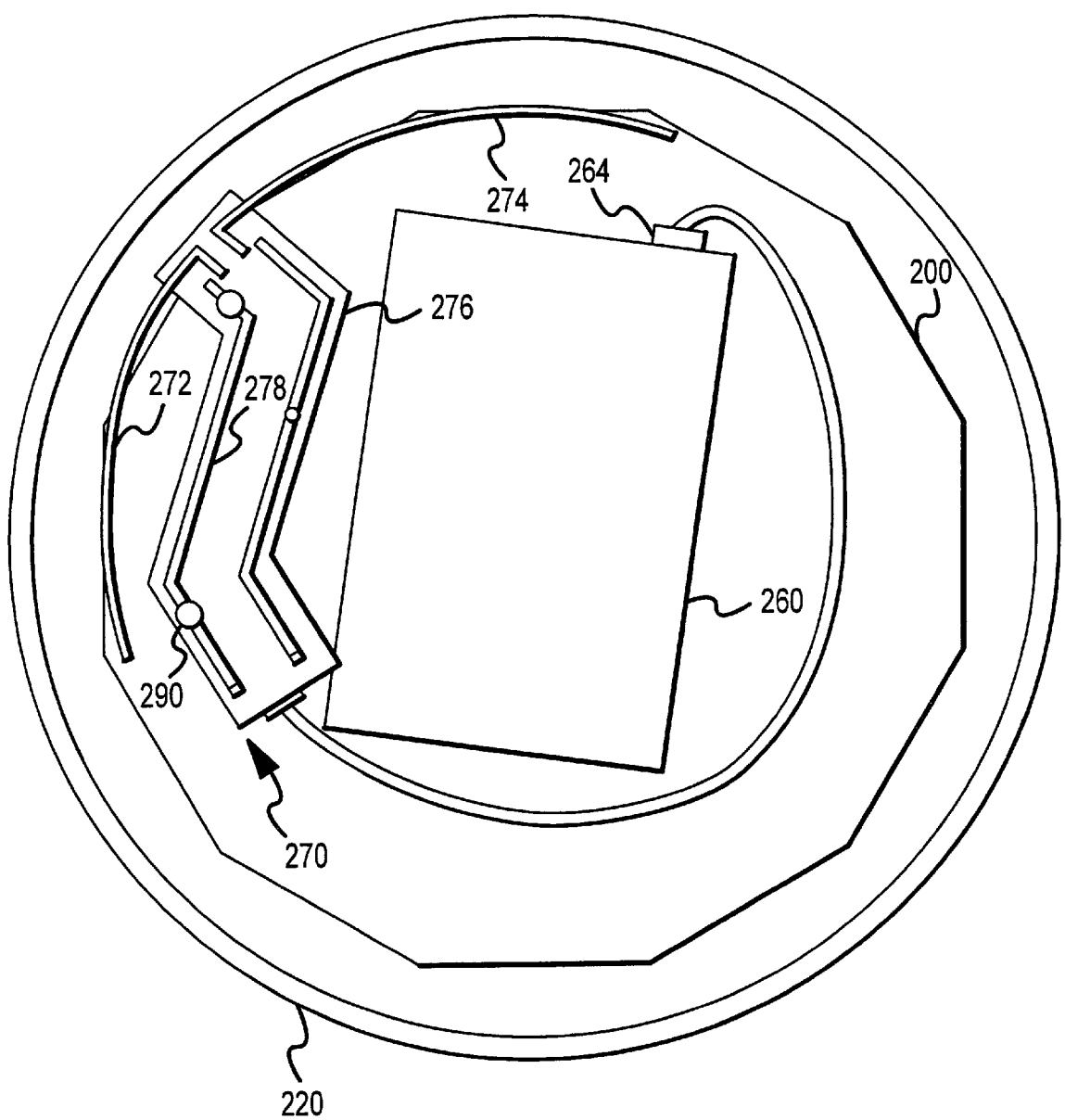
FIG. 2 illustrates a top view of a circuit board containing a wireless communication circuit and an antenna constructed according to the principles of the present invention.

Turning now to FIG. 2, illustrated is a top view of a circuit board 200 containing a wireless communication circuit 260 and an antenna 270 constructed according to the principles of the present invention. In the illustrated embodiment, the wireless communication circuit 260 is a Motorola 505sd transmit/receive modem. Of course, the use of other commercially-available or custom wireless communication circuits is well within the broad scope of the present invention. In one embodiment of the present invention, the wireless communication circuit 260 operates with a carrier frequency of between 700 and 950 megahertz. In a preferred embodiment, the wireless communication circuit 260 transmits at a frequency of about 806 to 825 megahertz and receives at a frequency of about 851 and 870 megahertz. Those skilled in the art will realize that the illustrated frequencies are compatible with conventional Ardis® or RAM Mobile Systems® Wireless Data networks. Of course, the principles of the present invention are equally applicable to other carrier frequencies and other wireless networks.

The antenna 270 contains antenna elements 272, 274, and a balance circuit 276. In one embodiment of the present invention, the antenna elements 272, 274 are arcuate, have a flattened lateral cross-section, and generally conform to a portion of an internal surface of a dielectric housing 220. In the illustrated embodiment, the antenna elements 272, 274 are composed of 0.028" thick copper, approximately 3.1" long and 0.25" wide, with a radius of curvature of about 2.625". Of course, other conductor shapes and radii of curvature are well within the broad scope of the present invention.

In the illustrated embodiment, the balance circuit 276 is a microstrip circuit board having conductive traces (one of which is labeled 278) located therein. The balance circuit 276 is coupled to and mechanically supports the antenna elements 272, 274. The antenna elements 272, 274 may thus cooperate to act as a dipole. The wireless communication circuit 260 has an unbalanced output port 264, coupled to the balance circuit 276. In the illustrated embodiment, the conductive traces 278 vary in width and therefore in impedance to balance an output impedance of the unbalanced output port 264. Of course, the broad scope of the present invention is not limited to this technique.

The circuit board 200 contains a plurality of mounts (one of which is designated 290) that position the balance circuit 276 above the circuit board 200. The antenna elements 272, 274 may thus be prevented from contacting and shorting to the circuit board 200.

Additionally, the mounts 290 allow the balance circuit 276 to be inverted, thereby reorienting the dipole formed by the antenna elements 272, 274, with respect to the circuit board 200. Reorientation of the dipole may improve transmission or reception of the wireless communication circuit 260, depending upon the location in which the meter 100 is mounted. In one embodiment of the present invention, the meter 100 may be mounted to a wall of a building. The antenna elements 272, 274 may thus cooperate to form a vertically-polarized, essentially omnidirectional dipole antenna. In a preferred embodiment, the dipole transmits and receives data over a distance of 10 to 40 miles, depending on environmental conditions, such as weather, line of site obstructions and a height of transmitting and receiving antennas. The meter 100 may thus communicate over the well-known ARDIS® or RAM Mobile Systems® Wireless Data networks.

Positioning the antenna 270 within the dielectric housing 220 may provide a number of advantages. The dielectric housing 220 may protect the antenna 270 from physical damage due to weather or contact with foreign objects. Additionally, strict criminal meter tampering laws may discourage vandals from damaging the antenna 270. Further, since separate installation of the antenna 270 is not necessary, the meter 100 may be installed using conventional techniques.

From the above, it is apparent that the present invention provides, for use with an electric meter chassis having a dielectric housing (of any geometry) protruding therefrom, an antenna for allowing electric meter circuitry within the chassis to communicate wirelessly through the dielectric housing and a method of manufacturing the same. In one embodiment, the antenna includes: (1) antenna elements, located within and generally conforming to a portion of an internal surface of the dielectric housing and adapted to transmit and receive electromagnetic radiation and (2) a balance circuit, coupled to the antenna elements to cause the antenna elements to act as an antenna and couplable to an unbalanced output port of a wireless communication circuit, that balances an impedance of the unbalanced output port thereby to balance the antenna.

Although the present invention has been described in detail, those skilled in the art should understand that they can make various changes, substitutions and alterations herein without departing from the spirit and scope of the invention in its broadest form.

What is claimed is:

1. An antenna for use with an electric meter chassis having a dielectric housing protruding therefrom, said antenna allowing electric meter circuitry within said chassis to communicate wirelessly through said dielectric housing, comprising:

antenna elements, located within said dielectric housing and adapted to transmit and receive electromagnetic radiation; and a balance circuit, coupled to said antenna elements to cause said antenna elements to act as said antenna and couplable to an unbalanced output port of a wireless communication circuit, that balances an impedance of said unbalanced output port thereby to balance said antenna.

2. The antenna as recited in claim 1 wherein said antenna elements generally conform to a portion of an internal surface of said dielectric housing.

3. The antenna as recited in claim 1 wherein said chassis comprises electric meter circuitry located in a circuit board rack within said dielectric housing, said antenna elements located between circuit boards in said circuit board rack.

4. The antenna as recited in claim 1 wherein said chassis comprises:
    electric meter circuitry located in said dielectric housing; and
    an electromagnetic shield located about at least a portion of said electric meter circuitry.

5. The antenna as recited in claim 1 wherein said antenna elements are arcuate and have a flattened lateral cross section.

6. The antenna as recited in claim 1 wherein said balance circuit is embodied on a circuit board having mounts located thereon and mechanically supports said antenna elements, said mounts allowing said antenna to be reoriented with respect to said dielectric housing.

7. The antenna as recited in claim 1 wherein said antenna elements are first and second conductors of a dipole and said balance circuit balances an impedance of said dipole.

8. The antenna as recited in claim 1 wherein said chassis comprises a wireless communication circuit having a carrier frequency of between 700 and 950 megahertz.

9. A method of manufacturing an antenna for use with an electric meter chassis having a dielectric housing protruding therefrom, said antenna allowing electric meter circuitry within said chassis to communicate wirelessly through said dielectric housing, comprising the steps of:
    locating antenna elements within said dielectric housing, said antenna elements adapted to transmit and receive electromagnetic radiation; and
    coupling a balance circuit to said antenna elements to cause said antenna elements to act as said antenna, said balance circuit couplable to an unbalanced output port of a wireless communication circuit to balance an impedance of said unbalanced output port and thereby balance said antenna.

10. The method as recited in claim 9 further comprising the step of causing said antenna elements generally to conform to a portion of an internal surface of said dielectric housing.

11. The method as recited in claim 9 further comprising the step of placing electric meter circuitry in a circuit board rack within said dielectric housing, said antenna elements located between circuit boards in said circuit board rack.

12. The method as recited in claim 9 further comprising the steps of:
    placing electric meter circuitry in said dielectric housing; and
    placing an electromagnetic shield about at least a portion of said electric meter circuitry.

13. The method as recited in claim 9 further comprising the step of forming said antenna elements into metal arcs having a flattened lateral cross section.

14. The method as recited in claim 9 further comprising the step of forming said balance circuit on a circuit board having mounts located thereon, said circuit board mechanically supporting said antenna elements, said mounts allowing said antenna to be reoriented with respect to said dielectric housing.

15. The method as recited in claim 9 wherein said antenna elements are first and second conductors of a dipole and said balance circuit balances an impedance of said dipole.

16. The method as recited in claim 9 further comprising the step of generating a carrier frequency of between 700 and 950 megahertz in a wireless communication circuit.

17. An electric meter, comprising:
    an electric meter chassis having a dielectric housing protruding therefrom;
    electric meter circuitry;
    a wireless communication circuit coupled to said electric meter circuitry; and
    an antenna for allowing said electric meter circuitry to communicate wirelessly through said dielectric housing, including:
        antenna elements, located proximate said electric meter circuitry, adapted to transmit and receive electromagnetic radiation, and
        a balance circuit, coupled to said antenna elements to cause said antenna elements to act as said antenna and to an unbalanced output port of said wireless communication circuit, that balances an impedance of said unbalanced output port thereby to balance said antenna.

18. The meter as recited in claim 17 wherein said antenna elements generally conform to an inner cylindrical surface of said dielectric housing.

19. The meter as recited in claim 17 further comprising an electromagnetic shield located about at least a portion of said electric meter circuitry.

20. The meter as recited in claim 17 wherein said antenna elements are arcuate and have a flattened lateral cross section.

21. The meter as recited in claim 17 wherein said balance circuit is embodied on a circuit board having mounts located thereon and mechanically supports said antenna elements, said mounts allowing said antenna to be reoriented with respect to said dielectric housing.

22. The meter as recited in claim 17 wherein said antenna elements are first and second conductors of a dipole, said balance circuit balancing an impedance of said dipole.

23. The meter as recited in claim 17 wherein said wireless communication circuit has a carrier frequency of between 700 and 950 megahertz.

24. The meter as recited in claim 17 wherein said wireless communication circuit communicates meter billing information.

25. The meter as recited in claim 17 wherein said wireless communication circuit communicates information selected from the group consisting of:
    energy usage,
    power demand, and
    power factor.

26. The meter as recited in claim 17 wherein said wireless communication circuit communicates information selected from the group consisting of:
    time of use, and
    interval recordings of energy usage.

27. The meter as recited in claim 17 wherein said wireless communication circuit communicates information selected from the group consisting of:

power quality information, power outage information, site analysis information, and diagnostic information.

28. The meter as recited in claim 17 wherein said chassis comprises a capacitively backed up power supply that powers said electric meter circuitry and said wireless communication circuit, thereby allowing said wireless communication circuit to communicate power outage information during a loss of power.

29. The meter as recited in claim 17 wherein said balance circuit is a microstrip.

30. The meter as recited in claim 17 wherein said chassis comprises a flex strip connector that couples said wireless communication circuit to said electric meter circuitry.

* * * * *

(12) EX PARTE REEXAMINATION CERTIFICATE (9184th)
United States Patent
Porter et al.

(10) Number: US 6,181,294 C1
(45) Certificate Issued: Aug. 14, 2012

(54) ANTENNA FOR ELECTRIC METER AND METHOD OF MANUFACTURING THEREOF

(75) Inventors: Lawrence R. Porter, Dallas, TX (US); John Paul King, Arlington, TX (US); Doug Justice, Wilsonville, OR (US)

(73) Assignee: TransData, Inc., Richardson, TX (US)

Reexamination Request:
No. 90/011,710, May 24, 2011

Reexamination Certificate for:
Patent No.: 6,181,294
Issued: Jan. 30, 2001
Appl. No.: 09/040,113
Filed: Mar. 17, 1998

(51) Int. Cl.
*G01D 4/00* (2006.01)
*H01Q 9/04* (2006.01)
*H01Q 9/16* (2006.01)
*H01Q 1/22* (2006.01)
*G01R 22/00* (2006.01)

(52) U.S. Cl. .......... 343/859; 324/142; 340/870.02; 340/870.03; 343/872; 343/719

(58) Field of Classification Search .............. None
See application file for complete search history.

(56) References Cited

To view the complete listing of prior art documents cited during the proceeding for Reexamination Control Number 90/011,710, please refer to the USPTO's public Patent Application Information Retrieval (PAIR) system under the Display References tab.

*Primary Examiner* — Anjan K. Deb

(57) ABSTRACT

For use with an electric meter chassis having a dielectric housing protruding therefrom, an antenna for allowing electric meter circuitry within the chassis to communicate wirelessly through the dielectric housing and a method of manufacturing the same. In one embodiment, the antenna includes: (1) antenna elements, located within the dielectric housing and adapted to transmit and receive electromagnetic radiation and (2) a balance circuit, coupled to the antenna elements to cause the antenna elements to act as an antenna and couplable to an unbalanced output port of a wireless communication circuit, that balances an impedance of the unbalanced output port thereby to balance the antenna.

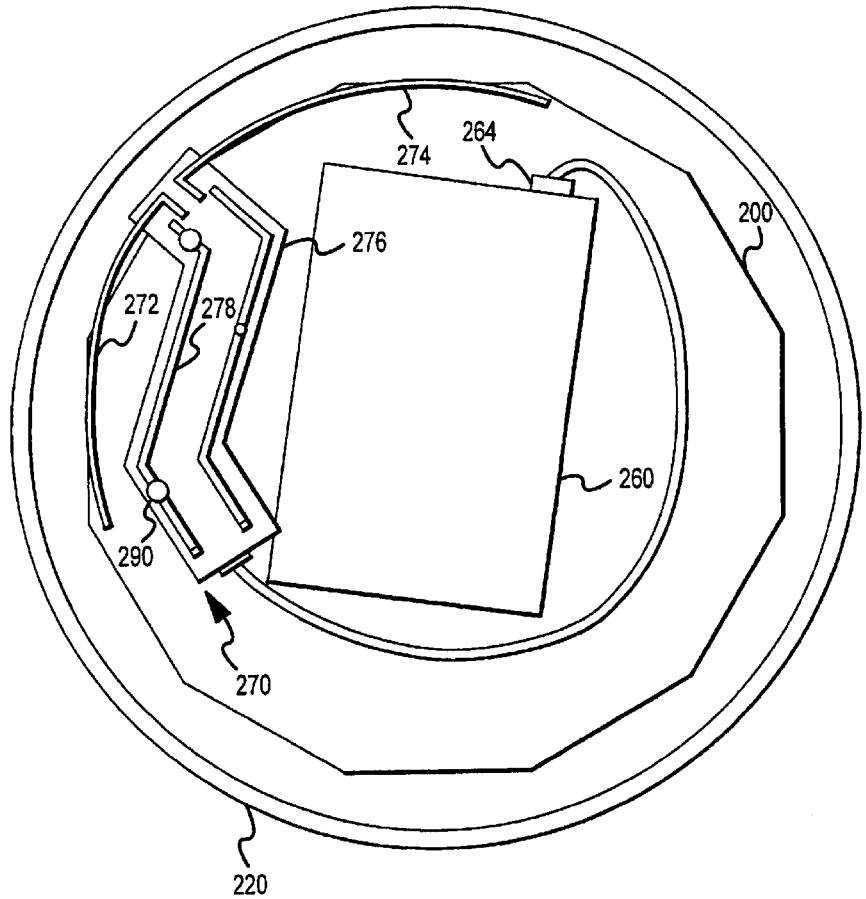

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 17-30 is confirmed.

Claims 1, 3, 4, 9, 11 and 12 are determined to be patentable as amended.

Claims 2, 5-8, 10 and 13-16, dependent on an amended claim, are determined to be patentable.

1. An antenna for use with an electric meter chassis having a dielectric housing protruding therefrom, said antenna allowing electric meter circuitry within said chassis to communicate wirelessly through said dielectric housing, comprising:
   antenna elements, located within said dielectric housing and adapted to transmit and receive electromagnetic radiation; and
   a balance circuit, coupled to said antenna elements to cause said antenna elements to act as said antenna and couplable to an unbalanced output port of a wireless communication circuit *that is also coupled to said electric meter circuitry,* that balances an impedance of said unbalanced output port thereby to balance said antenna.

3. The antenna as recited in claim 1 wherein said chassis comprises *said* electric meter circuitry located in a circuit board rack within said dielectric housing, said antenna elements located between circuit boards in said circuit board rack.

4. The antenna as recited in claim 1 wherein said chassis[: electric meter circuitry located in said dielectric housing; and] *further* comprises an electromagnetic shield located about at least a portion of said electric meter circuitry.

9. A method of manufacturing an antenna for use with an electric meter chassis having a dielectric housing protruding therefrom, said antenna allowing electric meter circuitry within said chassis to communicate wirelessly through said dielectric housing, comprising the steps of:
   locating antenna elements within said dielectric housing, said antenna elements adapted to transmit and receive electromagnetic radiation; and
   coupling a balance circuit to said antenna elements to cause said antenna elements to act as said antenna, said balance circuit couplable to an unbalanced output port of a wireless communication circuit *that is also coupled to said electric meter circuitry,* to balance an impedance of said unbalanced output port and thereby balance said antenna.

11. The method as recited in claim 9 further comprising the step of placing *said* electric meter circuitry in a circuit board rack within said dielectric housing, said antenna elements located between circuit boards in said circuit board rack.

12. The method as recited in claim 9 further comprising the [steps] *step* of[: placing electric meter circuitry in said dielectric housing; and] placing an electromagnetic shield about at least a portion of said electric meter circuitry.

* * * * *

(12) EX PARTE REEXAMINATION CERTIFICATE (10580th)
United States Patent
Porter et al.

(10) Number: US 6,181,294 C2
(45) Certificate Issued: Apr. 27, 2015

(54) ANTENNA FOR ELECTRIC METER AND METHOD OF MANUFACTURE THEREOF

(75) Inventors: Lawrence R. Porter, Dallas, TX (US); John Paul King, Arlington, TX (US); Doug Justice, Wilsonville, OR (US)

(73) Assignee: TRANSDATA, INC., Richardson, TX (US)

Reexamination Request:
No. 90/013,256, May 27, 2014

Reexamination Certificate for:
Patent No.: 6,181,294
Issued: Jan. 30, 2001
Appl. No.: 09/040,113
Filed: Mar. 17, 1998

Reexamination Certificate C1 6,181,294 issued Aug. 14, 2012

(51) Int. Cl.
*H01Q 1/22* (2006.01)
*G01D 4/00* (2006.01)
*G01R 22/00* (2006.01)
*H01Q 9/16* (2006.01)

(52) U.S. Cl.
CPC ............. *H01Q 1/2233* (2013.01); *G01D 4/004* (2013.01); *G01R 22/00* (2013.01); *H01Q 1/22* (2013.01); *H01Q 9/16* (2013.01); *Y02B 90/242* (2013.01); *Y04S 20/322* (2013.01)

(58) Field of Classification Search
None
See application file for complete search history.

(56) References Cited

To view the complete listing of prior art documents cited during the proceeding for Reexamination Control Number 90/013,256, please refer to the USPTO's public Patent Application Information Retrieval (PAIR) system under the Display References tab.

*Primary Examiner* — Robert Nasser

(57) ABSTRACT

For use with an electric meter chassis having a dielectric housing protruding therefrom, an antenna for allowing electric meter circuitry within the chassis to communicate wirelessly through the dielectric housing and a method of manufacturing the same. In one embodiment, the antenna includes: (1) antenna elements, located within the dielectric housing and adapted to transmit and receive electromagnetic radiation and (2) a balance circuit, coupled to the antenna elements to cause the antenna elements to act as an antenna and couplable to an unbalanced output port of a wireless communication circuit, that balances an impedance of the unbalanced output port thereby to balance the antenna.

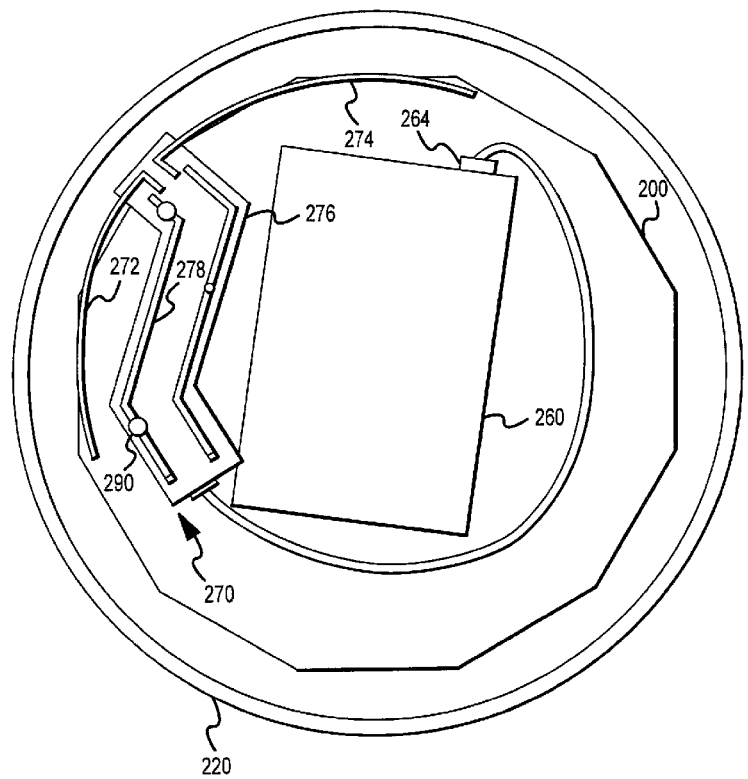

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 17-20 and 22-29 is confirmed.

Claims 1-16, 21 and 30 were not reexamined.

\* \* \* \* \*